(12) United States Patent
Newbury et al.

(10) Patent No.: US 7,135,879 B1
(45) Date of Patent: Nov. 14, 2006

(54) TEST STRUCTURE AND METHOD FOR FAILURE ANALYSIS OF SMALL CONTACTS IN INTEGRATED CIRCUIT TECHNOLOGY DEVELOPMENT

(75) Inventors: David C. Newbury, Saratoga, CA (US); Paul J. Steffan, Elk Grove, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 150 days.

(21) Appl. No.: 10/791,130

(22) Filed: Mar. 1, 2004

(51) Int. Cl.
*G01R 31/02* (2006.01)
(52) U.S. Cl. ...................... 324/765; 324/763
(58) Field of Classification Search ............ None
See application file for complete search history.

(56) References Cited

U.S. PATENT DOCUMENTS

| | | | | |
|---|---|---|---|---|
| 5,523,694 A | * | 6/1996 | Cole, Jr. ................ | 324/751 |
| 5,909,657 A | * | 6/1999 | Onishi et al. ............... | 702/108 |
| 5,936,876 A | * | 8/1999 | Sugasawara ................. | 365/51 |
| 5,970,167 A | * | 10/1999 | Colvin ....................... | 382/149 |
| 6,064,220 A | * | 5/2000 | Sugasawara et al. ........ | 324/765 |
| 6,395,580 B1 | * | 5/2002 | Tseng ......................... | 438/108 |
| 6,407,564 B1 | * | 6/2002 | Tseng ......................... | 324/755 |
| 6,549,022 B1 | * | 4/2003 | Cole et al. .................. | 324/752 |
| 6,605,951 B1 | * | 8/2003 | Cowan ....................... | 324/754 |
| 6,639,417 B1 | * | 10/2003 | Takao ......................... | 324/765 |
| 2005/0022085 A1 | * | 1/2005 | Vo et al. ..................... | 714/738 |

* cited by examiner

*Primary Examiner*—Jermele Hollington
(74) *Attorney, Agent, or Firm*—Mikio Ishimaru

(57) ABSTRACT

A method for failure analysis of small contacts in integrated circuits is provided. A number of opposing electrical contacts is configured to contact a sample in an offset pattern such that any one electrical contact may contact more than one conductor in the sample and any opposing electrical contact is offset-positioned to contact no more than one of the conductors contacted by the one electrical contact.

20 Claims, 4 Drawing Sheets

TEST STRUCTURE AND METHOD FOR FAILURE ANALYSIS OF SMALL CONTACTS IN INTEGRATED CIRCUIT TECHNOLOGY DEVELOPMENT

BACKGROUND

1. Technical Field

The present invention relates generally to semiconductor technology, and more specifically to semiconductor research and development.

2. Background Art

At the present time, electronic products are used in almost every aspect of life, and the heart of these electronic products is the integrated circuit. Integrated circuits are used in a wide variety of products, such as televisions, telephones, and appliances.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers in processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes. To reduce costs, only a few wafers are actually processed for each cycle. This research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems. For example, as the dimensions of individual features of a semiconductor wafer shrink with each new technology generation, it becomes ever more difficult to perform accurate failure analysis tests on the semiconductor devices. This is particularly true of the ever-smaller individual features, such as the distinct conductors and vias, in these devices. It is essential that the tests be performed accurately, easily, and quickly, since semiconductor wafers can each be worth thousands of dollars or more. Production corrections must consequently be made quickly and reliably, as soon as product problems or anomalies are detected.

The first step in resolving such issues is accurately diagnosing the source of the problem. This requires precision testing equipment that can be easily yet accurately and dependably operated. Integrated circuits are typically tested by contacting conductive pads on the semiconductor wafer with a probe unit that is connected to a probe card. The probe card contains the circuitry necessary to perform electrical diagnosis and characterization of the integrated circuits. A traditional probe unit includes "pogo" pins or needles suspended from the body of the probe unit for contacting the electrical pads of the integrated circuits of the wafer. The pins or needles are conductive, and thus, when in proper contact with the pads, provide electrical communication between an integrated circuit being tested and the diagnostic tester circuitry on the probe card.

When such testing reveals a defective chip or die on the wafer, it is sometimes necessary to examine individual features, such as individual metallic conductors or vias, within that die. This often involves removing part of the die structure to expose the interior elements that need to be tested. Sometimes a thin section of the die will be removed for testing. In all such cases, electrical connections must be made to the exposed structures. This can be far more difficult than the initial testing of the intact die, since the internal integrated circuit structures are much, much smaller. Thus, with ever smaller and smaller circuit structures and dimensions, known pad and probe contacts are increasingly proving to be inadequate.

More particularly, the relatively large distance between the contact elements on such pad and probe contacts makes it harder and harder to make proper, reliable contact with very small test points that are arranged in a very tight space. Too often, the test contact elements may contact more than one metallic element on the structure being tested.

A need therefore remains for tester contact structures that can assure accurate and proper connections to very small integrated circuit device structures under test.

Solutions to these problems have been long sought but prior developments have not taught or suggested any solutions and, thus, solutions to these problems have long eluded those skilled in the art.

DISCLOSURE OF THE INVENTION

The present invention provides a method for failure analysis of small contacts in integrated circuits. A number of opposing electrical contacts is configured to contact a sample in an offset pattern such that any one electrical contact may contact more than one conductor in the sample and any opposing electrical contact is offset-positioned to contact no more than one of the conductors contacted by the one electrical contact.

The invention provides methods and tester contact structures that can assure accurate and proper connections to very small integrated circuit device structures under test.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

A contact or via chain structure that can be easily electrically tested is provided. Contact plates are connected in a three dimensional offset pattern as described below. The offsets are by specified amounts from each other so that physical failure analysis of the contact/via chain structure by cutting a cross section of the structure one will always hit the centre of one of the contacts as well as both the leading and trailing edges as further described below.

Figure 1:
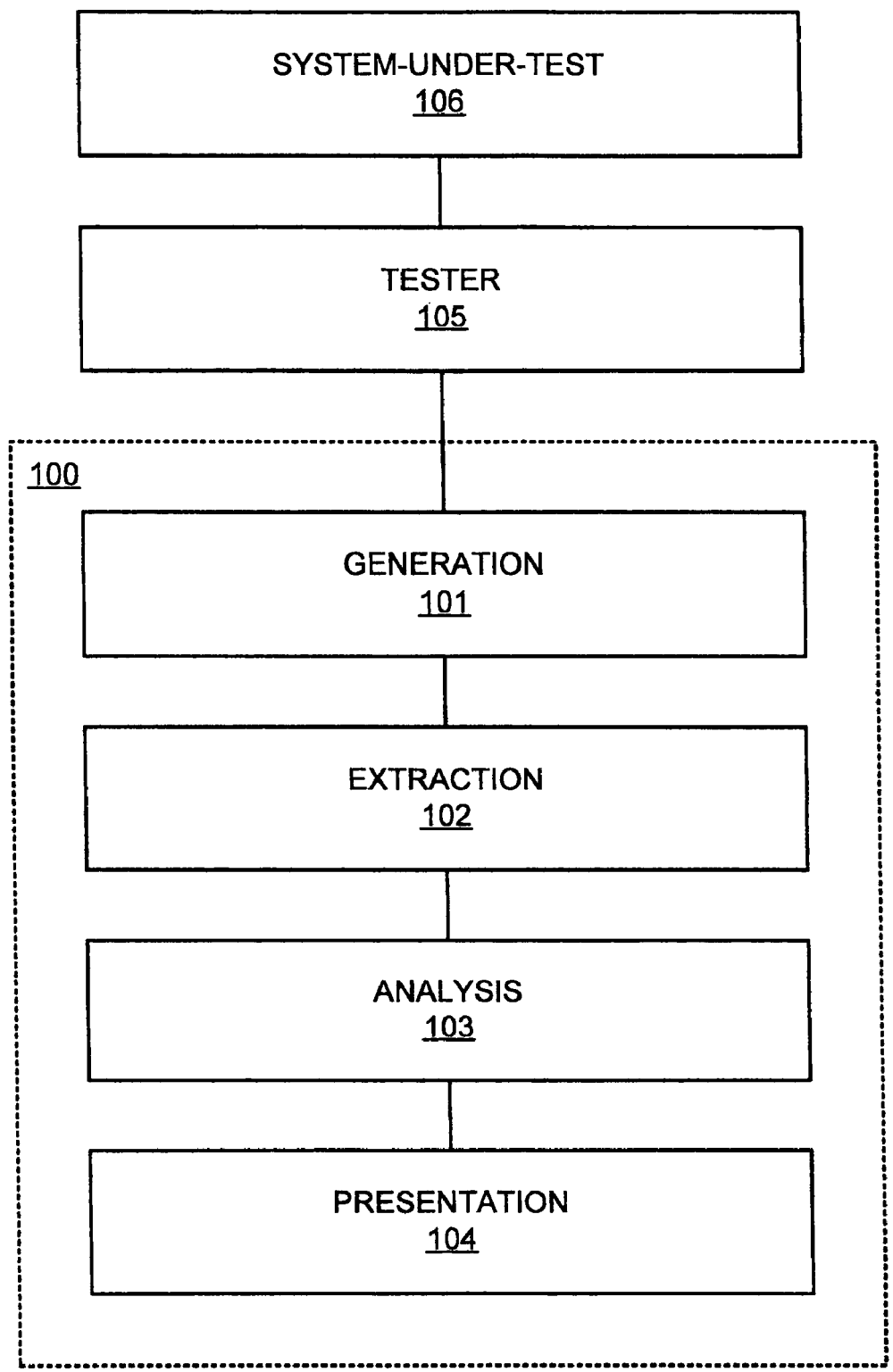
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system 100 receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, conventional test information, a personal computer, and so forth. It may also require new equipment and/or methods, which are described herein when required.

In the extraction block 102, usable information is extracted from the generated information from the generation block 101. Essentially, the generated information is translated into forms that are more useful; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points were determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
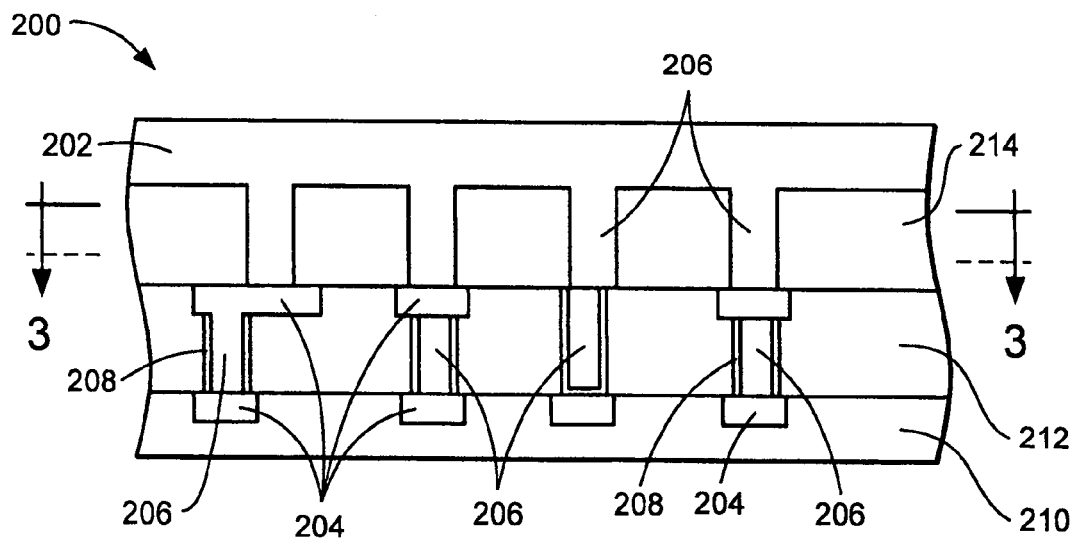
FIG. 2 is an illustrative view of a portion of a semiconductor device to be tested in accordance with the present invention.

Referring now to FIG. 2, therein is shown a portion 200 of a semiconductor device that is to be tested for possibly harboring a circuit defect, such as an open conductor or shorted conductors. Testing of the portion 200 will be to determine whether it meets design specifications, and if not, wherein the failure lies.

The portion 200 is an illustrative semiconductor configuration for purposes of describing and explaining the present invention. Accordingly, it will be readily understood that any other circuit portion may be selected and a specimen prepared therefrom for examination and testing in accordance with the teachings of the present invention.

The portion 200 includes horizontal interconnects such as a horizontal interconnect 202 that passes transversely as shown in FIG. 2. Similarly, the portion 200 includes horizontal interconnects 204 that pass in a direction normal to the plane of the FIG. 2 illustration (and are thus normal to the horizontal interconnect 202). Running vertically between the various elements of the portion 200, such as the horizontal interconnects 202 and 204, are vias 206 that provide electrical connections therebetween. Several of the vias 206 are protected by an insulator 208. These elements are surrounded by and located within various insulator layers, such as a first insulator layer 210, a second insulator layer 212, and a third insulator layer 214.

To test the integrity of the vias 206 in the medial region of the third insulator layer 214, one embodiment of the present invention is implemented as follows. Using known techniques, a specimen slice 302 (see also FIG. 3) of this medial region is prepared. The region for the specimen slice 302 is indicated by the section arrows 3 in FIG. 2, and portions of the resulting specimen slice 302 are shown in FIGS. 3 and 4.

Figure 3:
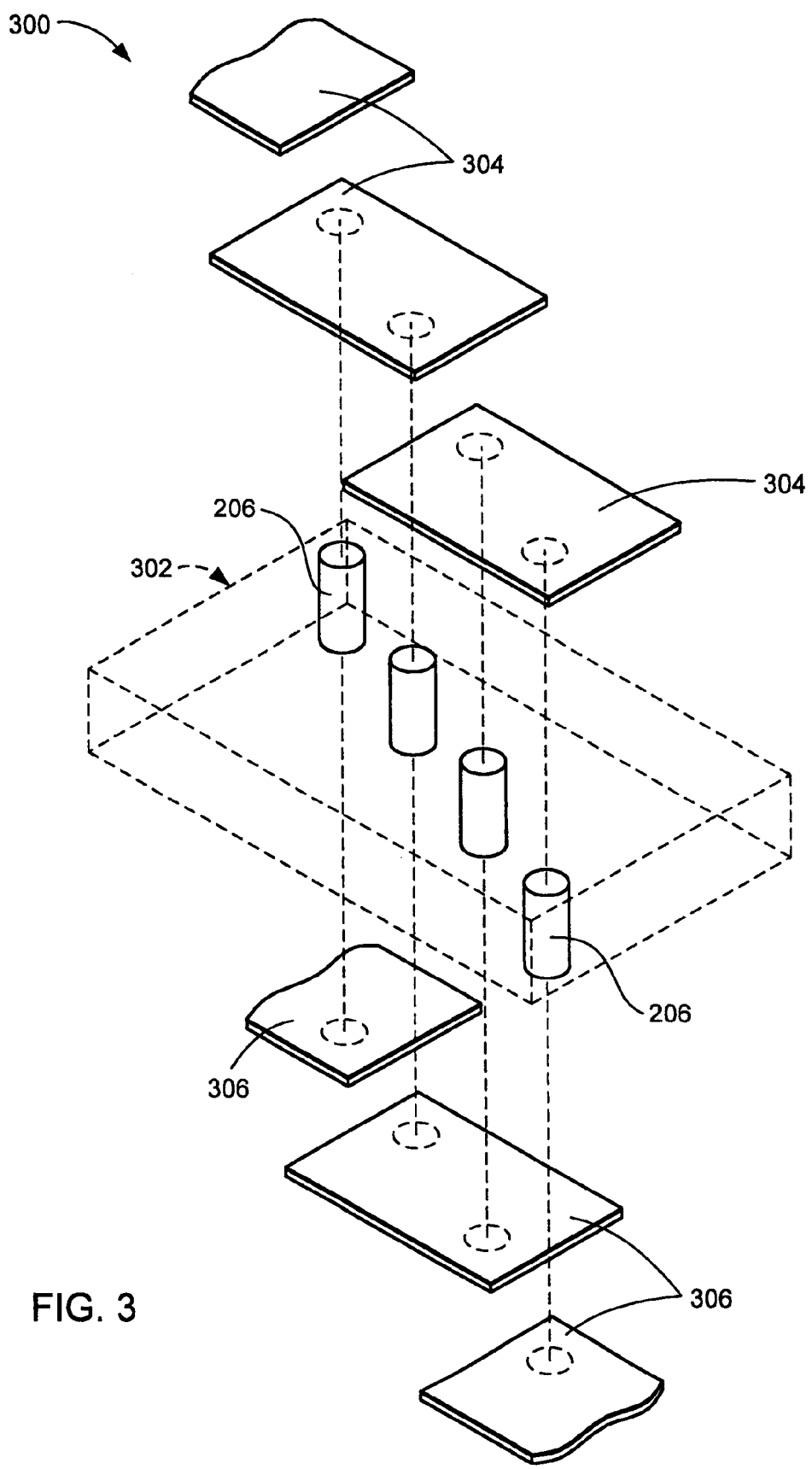
FIG. 3 is an exploded view of a specimen slice and micro-contacts for testing electrical integrity and continuity of a portion of the semiconductor device shown in FIG. 2.

Referring now to FIG. 3, therein is shown an exploded view 300 of the specimen slice 302 and the upper and lower micro-contacts that are provided for making electrical contact with the vias 206 to test the electrical integrity and continuity of the vias. The micro contacts comprise upper electrical contacts 304 and lower electrical contacts 306. Due to the extremely small dimensions of contemporary semiconductor integrated circuit elements, it is difficult to configure and construct electrical tester contacts that are small enough to be accurately positioned for reliable contact with only a single conductor target, such as one of the vias 206. Rather, as each succeeding generation of integrated circuit features gets smaller and smaller, there is an increasing risk that even the smallest tester contacts will contact more than one of the specimen conductors under examination.

It has been discovered, as taught herein, that individual and unique electrical elements in a test specimen can be electrically tested individually even though the electrical tester micro contacts may be making contact with more than one of the electrical elements in the specimen under test. Thus, as taught herein, the electrical elements under test can be electrically isolated by configuring the upper electrical contacts 304 in an offset pattern with respect to the lower electrical contacts 306. In this manner, any particular electrical contact may be in contact with more than one conductor in the specimen, but the opposing electrical contacts are offset-positioned to contact respectively only one of the conductors contacted by the particular electrical contact.

Figure 4:
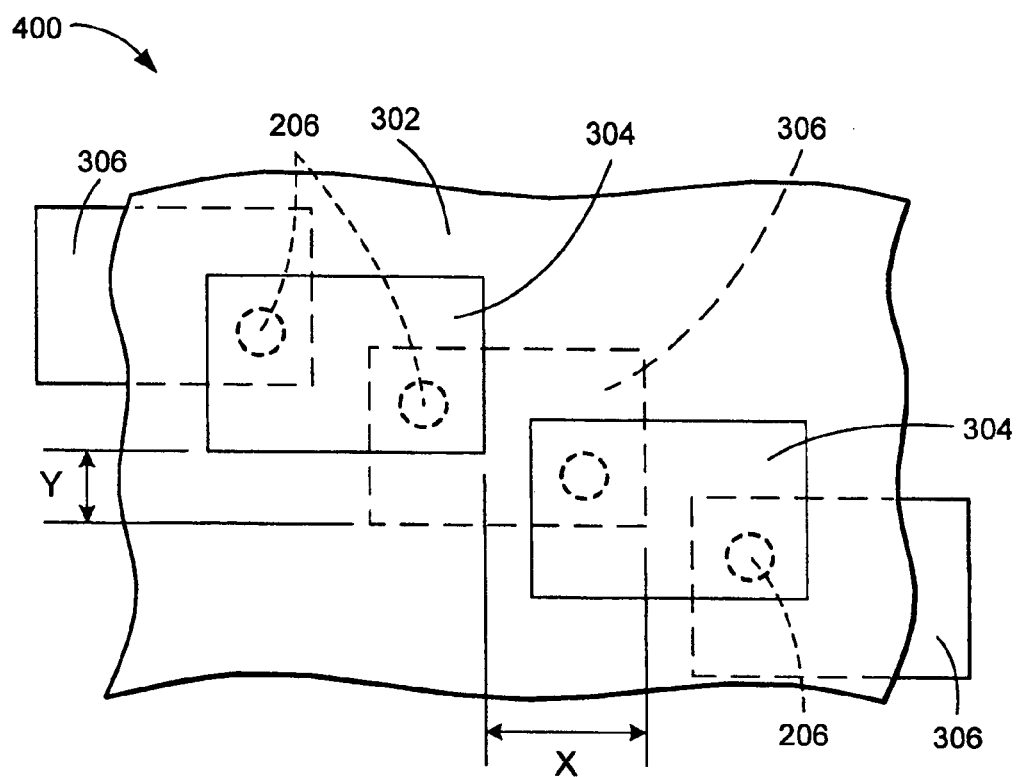
FIG. 4 is a fragmentary top plan view of the elements depicted in FIG. 3 assembled in a testing configuration.

Referring now to FIG. 4, therein is shown a fragmentary top plan view 400 of the elements depicted in FIG. 3, assembled into a testing configuration in which the upper electrical contacts 304 and the lower electrical contacts 306 are in physical contact with the specimen slice 302. Due to the offset contact pattern, for any single upper electrical contact 304 and any single lower electrical contact 306, there is only one via 206 that is connected between that contact pair. This is true, notwithstanding that each of the upper electrical contacts 304 and each of the lower electrical contacts 306 is individually in contact with two of the vias 206. The isolation of the individual vias with respect to any given pair of contacts, one upper and one lower, is a result of the lateral offset of the lower electrical contacts 306 with regard to the upper electrical contacts 304 (and vice versa). In one embodiment, the offset is represented by the dimension X.

Actual semiconductor devices typically have electrical elements positioned in many different locations in a specimen, not necessarily lined up neatly in straight horizontal or vertical rows. This variation in position is depicted in a simplified manner by showing the vias 206 (FIGS. 3 and 4) in a diagonally staggered pattern. To accommodate such positional variations and/or irregularities, the upper electrical contacts 304 and the lower electrical contacts 306 may be offset from each other in an additional dimension and at an independently selected distance represented by Y, perpendicular to X. The offsets (or staggers) X and Y can therefore be selected and adjusted according to the parameters or design rules of the specimen being examined. The dimensions X and Y may also be varied from contact to contact between adjacent contacts on the same and opposite sides of the test specimen, as needed and appropriate to assure that unique connections are made between each pair of the upper and lower electrical contacts. This assures that unique circuit connections are made notwithstanding that any given electrical tester contact may be connected to more than one conductor in the test specimen.

Figure 5:
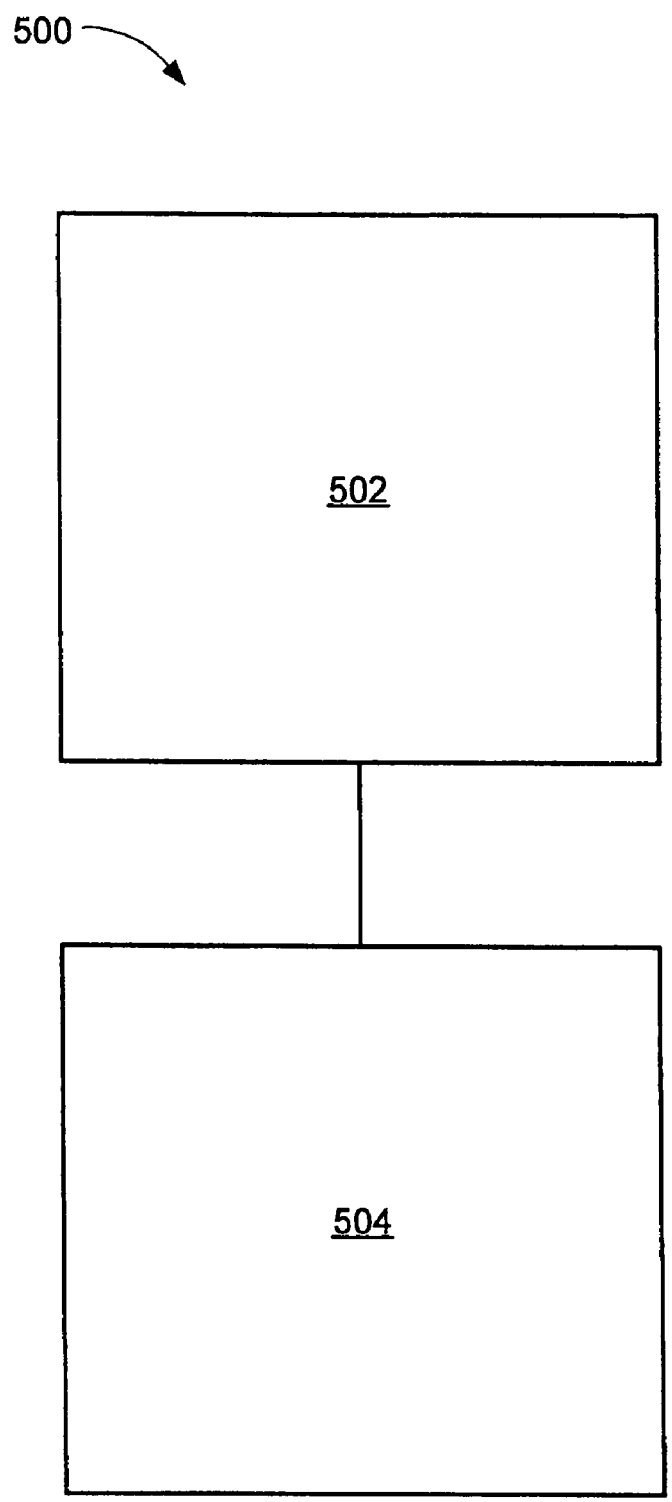
FIG. 5 is a flow chart of a method for failure analysis of small contacts in integrated circuits in accordance with the present invention.

Referring now to FIG. 5, therein is shown a flow chart of a method 500 for failure analysis of small contacts in integrated circuits in accordance with the present invention. The method 500 includes providing a plurality of opposing electrical contacts in a block 502; and configuring the electrical contacts to contact a sample in an offset pattern such that any one electrical contact may contact more than one conductor in the sample and any opposing electrical contact is offset-positioned to contact no more than one of the conductors contacted by the one electrical contact in a block 504.

Thus, it has been discovered that the test structure method and apparatus of the present invention furnish important and heretofore unavailable solutions, capabilities, and functional advantages for failure analysis of small contacts in integrated circuit technology development and production management. For example, the electrical contacts may be symmetrical (e.g. circular or square), or oblong as illustrated. Such choices may be made according to the application and needs at hand.

In another embodiment, a specimen slice, such as the specimen slice 302, may be prepared to provide for parametric testing of the array of electrical contacts, such as the upper electrical contacts 304 and the lower electrical contacts 306. In such a configuration, the specimen slice 302 would constitute a parametric test structure that could be advantageously employed not only for testing the integrity and functionality of the electrical contact configuration, but in addition, could be readily configured and utilized for adjusting the X and Y offsets to the target dimensions for the particular testing application at hand.

In still another embodiment, the method and apparatus, and in particular the electrical contact arrays, can serve as an adjunct to a production line for periodic testing of semiconductor integrated circuit device features, such as vias and contacts, during fabrication.

In yet another embodiment, the method and apparatus, and in particular the electrical contact arrays, can be utilized to identify (or to confirm the identity of) the manufacturing equipment and/or the semiconductor integrated circuit devices present in an operating manufacturing process or environment, by determining the configurations of the upper and lower electrical contacts in use, as well as their offset configurations.

The resulting testing method and tester configurations are straightforward, economical, uncomplicated, highly versatile and effective, use conventional technologies, and are thus readily suited for use in support of manufacturing highly complex and extremely small semiconductor integrated circuit devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method for failure analysis of small contacts in integrated circuits, comprising:
    providing a plurality of opposing electrical contacts; and
    configuring the electrical contacts to contact a sample in an offset pattern such that any one electrical contact may contact more than one conductor in the sample and any opposing electrical contact is offset-positioned to contact no more than one of the conductors contacted by the one electrical contact.

2. The method of claim 1 further comprising configuring the contacts to be offset in two perpendicular lateral directions.

3. The method of claim 2 wherein the respective offsets in the two perpendicular lateral directions are unequal and vary from contact to contact.

4. The method of claim 1 further comprising providing a parametric test structure for testing the opposing contacts.

5. The method of claim 4 further comprising using the parametric test structure to adjust the offset pattern of the contacts.

6. A method for failure analysis of small contacts in integrated circuits, comprising:
    providing a plurality of opposing electrical contact arrays; and
    configuring the electrical contact arrays to contact a sample in a pattern that is offset in two perpendicular lateral directions such that any one electrical contact in one of the contact arrays may contact more than one conductor in the sample and any opposing electrical contact in an opposing contact array is offset-positioned to contact no more than one of the conductors contacted by the one electrical contact.

7. The method of claim 6 wherein the respective offsets in the two perpendicular lateral directions are unequal and vary from contact to contact.

8. The method of claim 6 further comprising providing a parametric test structure for testing the opposing contacts.

9. The method of claim 8 further comprising using the parametric test structure to adjust the offset pattern of the contacts.

10. The method of claim 6 further comprising using the electrical contact arrays for at least one of:
    periodically testing integrated circuits during fabrication; and
    identifying at least one of the manufacturing equipment and the integrated circuits present in an operating manufacturing process.

11. A tester for failure analysis of small contacts in integrated circuits, comprising:
    a plurality of opposing electrical contacts; and
    means for configuring the electrical contacts to contact a sample in an offset pattern such that any one electrical contact may contact more than one conductor in the sample and any opposing electrical contact is offset-positioned to contact no more than one of the conductors contacted by the one electrical contact.

12. The tester of claim 11 wherein the contacts are offset in two perpendicular lateral directions.

13. The tester of claim 12 wherein the respective offsets in the two perpendicular lateral directions are unequal and vary from contact to contact.

14. The tester of claim 11 further comprising a parametric test structure for testing the opposing contacts.

15. The tester of claim 14 further comprising means for using the parametric test structure to adjust the offset pattern of the contacts.

16. A tester for failure analysis of small contacts in integrated circuits, comprising:
    a plurality of opposing electrical contact arrays; and
    means for configuring the electrical contact arrays to contact a sample in a pattern that is offset in two perpendicular lateral directions such that any one electrical contact in one of the contact arrays may contact more than one conductor in the sample and any opposing electrical contact in an opposing contact array is offset-positioned to contact no more than one of the conductors contacted by the one electrical contact.

17. The tester of claim 16 wherein the respective offsets in the two perpendicular lateral directions are unequal and vary from contact to contact.

18. The tester of claim 16 further comprising a parametric test structure for testing the opposing contacts.

19. The tester of claim 18 further comprising means for using the parametric test structure to adjust the offset pattern of the contacts.

20. The tester of claim 16 further comprising means for using the electrical contact arrays for at least one of:
    periodically testing integrated circuits during fabrication; and
    identifying at least one of the manufacturing equipment and the integrated circuits present in an operating manufacturing process.

* * * * *